(12) United States Patent
Miskovic et al.

(10) Patent No.: US 12,034,396 B2
(45) Date of Patent: Jul. 9, 2024

(54) FAST POR TRIM CORRECTION

(71) Applicant: Hamilton Sundstrand Corporation, Charlotte, NC (US)

(72) Inventors: Vlatko Miskovic, Loves Park, IL (US); Shawn J. Young, Sycamore, IL (US); Dwight D. Schmitt, Rockford, IL (US); Matthew Ryan Hasseman, Poplar Grove, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 729 days.

(21) Appl. No.: 17/141,012

(22) Filed: Jan. 4, 2021

(65) Prior Publication Data

US 2022/0216815 A1 Jul. 7, 2022

(51) Int. Cl.
*H02P 9/00* (2006.01)
*H02P 9/10* (2006.01)
*H03H 17/00* (2006.01)

(52) U.S. Cl.
CPC ..... *H02P 9/102* (2013.01); *H03H 2017/0081* (2013.01)

(58) Field of Classification Search
CPC ........ H02P 9/102; H02P 2101/30; H02P 9/00; H02H 7/06; H03H 17/02; H03H 2017/0081; H03H 2017/009
See application file for complete search history.

(56) References Cited

U.S. PATENT DOCUMENTS

| | | | |
|---|---|---|---|
| 5,488,532 A * | 1/1996 | Mrowiec | H02H 7/267 361/87 |
| 6,353,568 B1 | 3/2002 | Sung | |
| 6,377,086 B1 | 4/2002 | Bays et al. | |
| 6,504,486 B1 | 1/2003 | Jong et al. | |
| 6,815,983 B2 | 11/2004 | Owen | |
| 6,901,012 B2 | 5/2005 | Ikehashi et al. | |
| 10,630,279 B2 | 4/2020 | Kawahara et al. | |
| 2018/0181179 A1 | 6/2018 | Kowkutla et al. | |
| 2018/0275188 A1* | 9/2018 | Dzienis | G01R 31/088 |
| 2020/0021111 A1* | 1/2020 | White | H02J 3/0012 |

FOREIGN PATENT DOCUMENTS

| | | |
|---|---|---|
| CN | 205263697 U | 5/2016 |
| CN | 105425887 B | 4/2017 |
| EP | 2658062 A2 | 10/2013 |

OTHER PUBLICATIONS

Extended European Search Report for European Patent Application No. EP22150102.6, dated Jun. 2, 2022.

\* cited by examiner

*Primary Examiner* — Julio C. Gonzalez

(57) ABSTRACT

A system comprises a generator control unit (GCU) configured to control a generator. The system includes a first sensor connected to provide feedback to the GCU for generator control. The first sensor is configured to connect to sense at least one of voltage and/or current in a feeder connecting between the generator and a load. The system also includes a second sensor connected to provide feedback to the GCU for generator control. The second sensor is configured to sense at least one of voltage and/or current in a feeder connecting between the generator and the load. The first and second sensors are configured to connect to the feeder apart from one another with feeder impedance therebetween.

19 Claims, 4 Drawing Sheets

FAST POR TRIM CORRECTION

BACKGROUND

1. Field

The present disclosure relates to generator control, and more particularly to fault detection for generator control.

2. Description of Related Art

Sensors can be used on generator feeders to generate feedback for controlling the generator. It is possible to lose control of a generator if the sensor is defective or becomes defective, even if the generator, feeder, and loads are fully functional. One way of handling this event is to shut down the generator until the defect in the sensor can be corrected.

The conventional techniques have been considered satisfactory for their intended purpose. However, there is an ever present need for improved systems and methods for faster fault detection and correction. This disclosure provides a solution for this need.

SUMMARY

A system comprises a generator control unit (GCU) configured to control a generator. The system includes a first sensor connected to provide feedback to the GCU for generator control. The first sensor is configured to sense at least one of voltage and/or current in a feeder connecting between the generator and a load. The system also includes a second sensor connected to provide feedback to the GCU for generator control. The second sensor is configured to sense at least one of voltage and/or current in the feeder connecting between the generator and the load. The first and second sensors are configured to connect to the feeder apart from one another with feeder impedance therebetween.

The first sensor can be configured to sense at least one of voltage and/or current in each one of three phases of the feeder, and the second sensor can be configured to sense at least one of voltage and/or current in each one of three phases of the feeder.

The system can further include the generator operatively connected to be controlled by the GCU, and the can be feeder connected to supply power from the generator to a load. The first sensor can be electrically closer to the generator than to a load end of the feeder than the second sensor relative to feeder impedance.

The system can also include logic in the GCU, which can be configured to cause the GCU to use feedback from the first and second sensors to control the generator. The logic can be configured to detect faults in each of the first and second sensors and continue operation of the generator in the event of only one of the sensors faulting. The logic can be configured to cause the GCU to detect a discrepancy between the first and second sensors, decide whether the first sensor is at fault or whether the second sensor is at fault when detecting the discrepancy, and control the generator based on feedback from whichever of the first or second sensors are not at fault.

Detecting a discrepancy can include comparing summed magnitudes or magnitudes squared of voltage and/or current sensed for each of three phases of the feeder for each of the first and second sensor versus a respective threshold [V_OSF_TH and −V_OSF_TH] for each of VPOR_OSF (voltage open sense failure at the point of regulation for the second sensor) and VGEN_OSF (voltage open sense failure at the point of the first sensor). VPOR_OSF can be logic for comparing the V_OSF_Th threshold to the summed magnitudes or magnitudes squared of voltage and/or current sensed for each of three phases of the feeder for each of the first and second sensor. VGEN_OSF can be logic for comparing the −V_OSF_Th threshold to the summed magnitudes or magnitudes squared of voltage and/or current sensed for each of three phases of the feeder for each of the first and second sensor.

Each of the VPOR_OSF and VGEN_OSF can connect through a latch to a respective switch for switching off faulty feedback from the respective one of the first and second sensors to the GCU. Detecting the discrepancy can also include transforming three phases from each of the first and second sensors to Alpha-Beta coordinates, then taking the magnitude of the Alpha-Beta for each.

The system can include filtering when deciding. The system can filter based on whether the difference of magnitudes (or magnitudes squares) exceeds a threshold a certain number of consecutive times. Additionally, or alternatively, the system can filter by difference of magnitudes (or magnitudes squares) is a processed through an infinite impulse response (IIR) filter. Additionally, or alternatively, the system can filter by difference of magnitudes (or magnitudes squares) is a processed through a finite impulse response (FIR) filter.

A method comprises using feedback from first and second sensors spaced apart along a feeder to control a generator powering a load through the feeder. The method also includes detecting a fault in one of the first and second sensors and continuing operation of the generator.

These and other features of the systems and methods of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
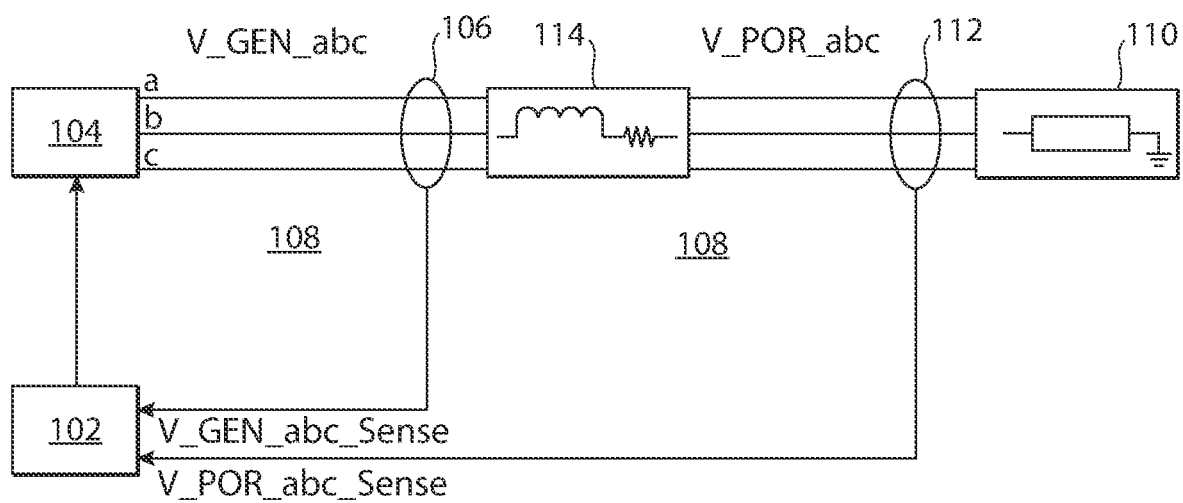
FIG. 1 is a schematic plan view of an embodiment of a generator control system constructed in accordance with the present disclosure, showing feedback control circuit.

Reference will now be made to the drawings wherein like reference numerals identify similar structural features or aspects of the subject disclosure. For purposes of explanation and illustration, and not limitation, a partial view of an embodiment of a system in accordance with the disclosure is shown in FIG. 1 and is designated generally by reference character 100. Other embodiments of systems in accordance with the disclosure, or aspects thereof, are provided in FIGS. 2-5, as will be described. The systems and methods described herein can be used to quickly determine a fault and accommodate using minimal resources.

A system 100 comprises a generator control unit (GCU) 102 that can be configured to control a generator 104. The generator 104 can be operatively connected to the GCU 102 to be controlled by the GCU 102, and the feeder 108 can be connected to the generator 104 to supply power from the generator 104 to a load 110. The system 100 can include a first sensor 106 connected to a feeder 108 to provide feedback to the GCU 102 for generator control. The first sensor 106 can be configured to sense at least one of voltage and/or current in the feeder 108, the feeder 108 connecting between the generator 104 and the load 110. The system 100 can also include a second sensor 112 connected to the feeder 108 to provide feedback to the GCU 102 for generator control. The second sensor 112 can also be configured to sense at least one of voltage and/or current in the feeder 108. The first and second sensors 106,112 can be configured to connect to the feeder 108 separated by a feeder impedance 114.

As shown in FIG. 1, the first sensor and second sensors 106, 112 each can be configured to sense at least one of voltage and/or current in each one of three phases, a,b,c, of respective portions of the feeder 108. For example, the first sensor 106 can be electrically closer to the generator 104 than to the load 110 end of the feeder 108 than the second sensor 112 relative to the feeder impedance 114.

Figure 2:
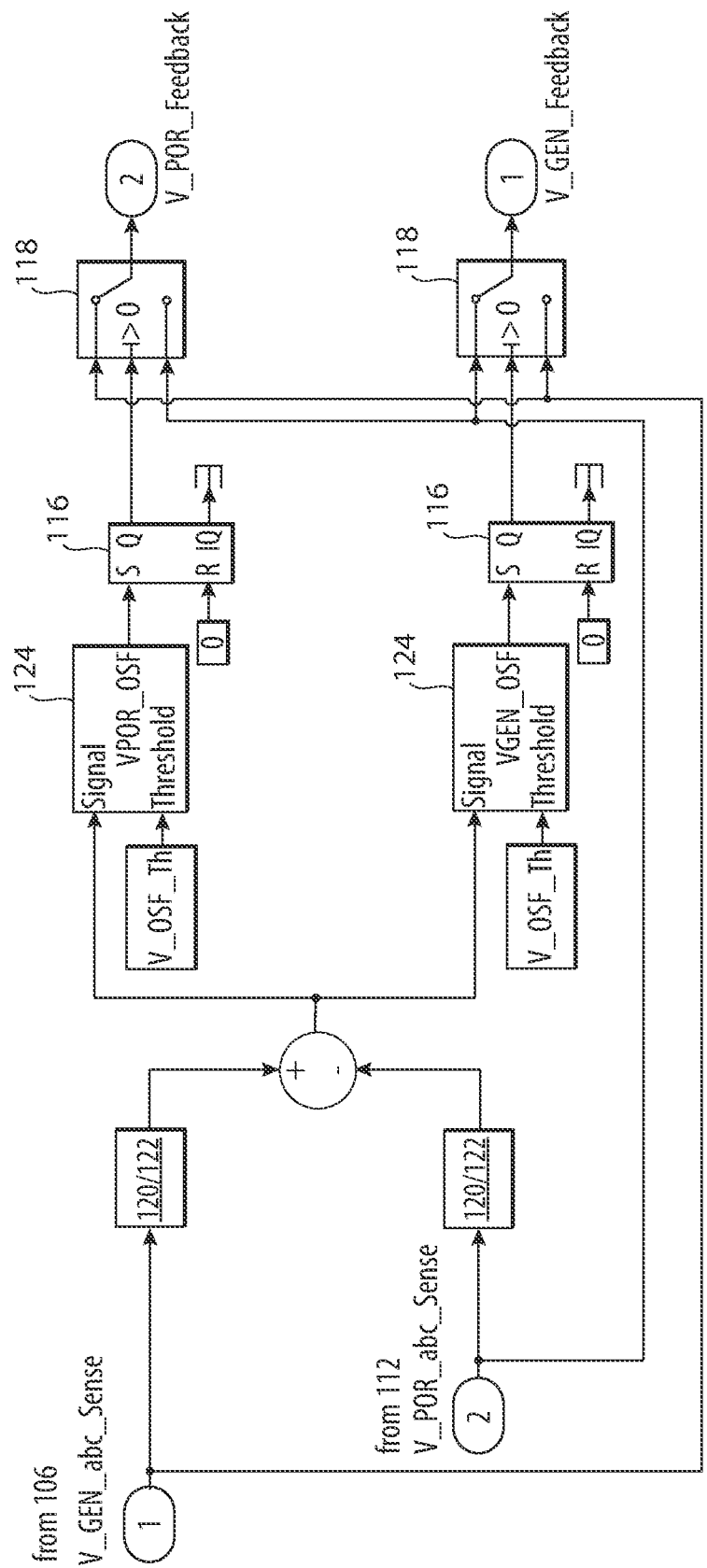
FIG. 2 is a schematic logic diagram showing the generator control unit of FIG. 1.

Referring now to FIG. 2, the system 100 can also include logic in the GCU 102. The logic can include machine readable instructions, digital circuitry, analog circuitry, any combination of thereof, and/or any other suitable form of logic. The logic can be configured to cause the GCU 102 to use feedback from the first and second sensors 106,112 to control the generator 104. For example, the logic can be configured to detect faults in each of the first and second sensors 106,112, and even if a fault is detected, the logic can continue operation of the generator 104. In embodiments, the logic can be configured to cause the GCU 102 to detect a discrepancy between the first and second sensors 106,112 and decide whether the first sensor 106 is at fault or whether the second sensor 112 is at fault. After detection and determination of which sensor has faulted, the logic can then control the generator 104 based on feedback from whichever of the first or second sensors 106,112 are not at fault. This process will be described in more detail below.

Figure 3:
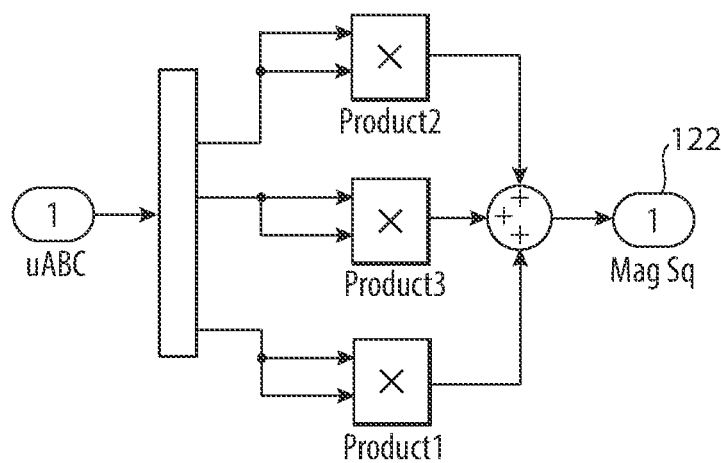
FIG. 3 is a schematic logic diagram showing a method of calculating magnitudes squared.
Figure 4:
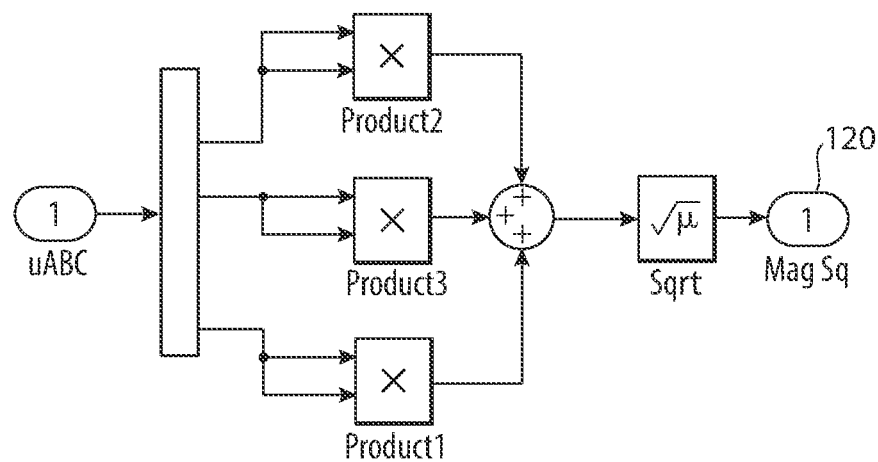
FIG. 4 is a schematic logic diagram showing a method of calculating magnitudes.
Figure 5:
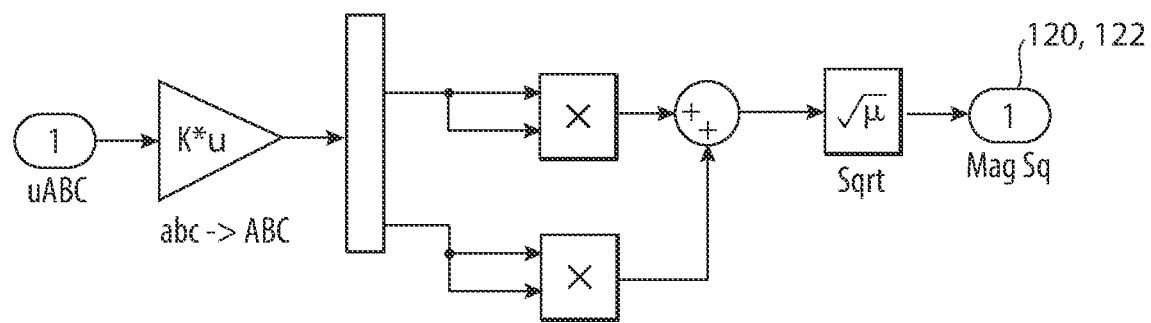
FIG. 5 is a schematic logic diagram showing another method of calculating a magnitudes or magnitudes squared.

In FIG. 2, feedback from the first sensor 106 is represented by V_GEN_abc_Sense, and feedback from the second sensor 112 is represented by V_POR_abc_Sense. The logic can then calculate the sum voltage/current magnitude or the voltage/current magnitude square for each of V_POR_abc_Sense and V_GEN_abc_Sense using either of the methods shown in FIGS. 3-4. For example, FIG. 3 shows a method for calculating a magnitude squared, while FIG. 4 shows a method for calculating a magnitude. FIG. 5 shows an alternative method for calculating either a magnitude and/or a magnitude squared. While FIG. 5 shows a square root step, it should be appreciated that this step is optional if a magnitude is desired over a magnitude squared.

In order to quickly detect a discrepancy, the logic can then compare the summed magnitudes or magnitudes squared 120,122 of voltage and/or current sensed for each of three phases a,b,c of the feeder 108 for each of the first and second sensor 106,112 versus a respective threshold [e.g. V_OSF_TH and −V_OSF_TH] for each of VPOR_OSF (voltage open sense failure at the point of regulation for the second sensor) and VGEN_OSF (voltage open sense failure at the point of the first sensor), e.g. using a comparator 124.

VPOR_OSF can represent logic for comparing the V_OSF_Th threshold to the summed magnitudes or magnitudes squared 120,122 of voltage and/or current sensed for each of three phases a,b,c of the feeder 108 for each of the first and second sensor 106,112. VGEN_OSF can represent logic for comparing the −V_OSF_Th threshold to the summed magnitudes or magnitudes squared 120,112 of voltage and/or current sensed for each of three phases a,b,c of the feeder 108 for each of the first and second sensor 106,112.

After comparing the sensed voltage and/or current with the threshold as described above, each of the VPOR_OSF and VGEN_OSF can connect through a respective latch 116 to a respective switch 118. The latch 116 latch can be disposed within each branch of the logic diagram as shown, so that the latch 116 can suppress a faulted sense. Once a sense has passed through latch 116, the latch 116 must be reset to resume normal two sense operation. If a fault is detected in either branch, the switches 118 can then switch off faulty feedback from the respective one of the first and second sensors 106,112 to the GCU 102. Optionally, when detecting a discrepancy, the logic can include transforming three phases from each of the first and second sensors 106,112 to Alpha-Beta coordinates, and then taking the magnitude of the Alpha-Beta for each, for example as shown in FIG. 5.

The system 100 can include filtering when deciding which of the first and/or second sensors 106,112 is experiencing fault. The system can filter based on whether the difference of magnitudes 120 (or magnitudes squared 122) exceeds a threshold a certain number of consecutive times. Additionally, or alternatively, the filter can be a difference of magnitudes 120 (or magnitudes squared 122) is processed through an infinite impulse response (IIR) filter, for example a low pass filter. Additionally, or alternatively, the filter can be difference of magnitudes (or magnitudes squared 122) is processed through a finite impulse response (FIR) filter, for example a moving average filter.

Figure 6:
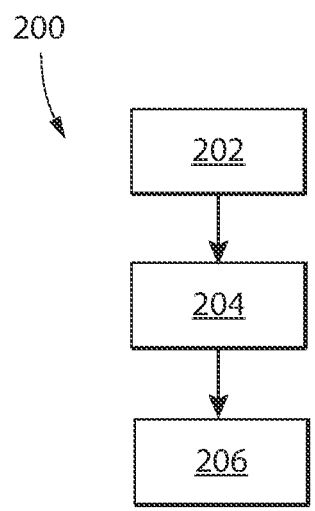
FIG. 6 is a schematic box diagram showing a method in accordance with at least one aspect of this disclosure.

In FIG. 6, a method 200 can comprise, at box 202, using feedback from first and second sensors 106,112 spaced apart along a feeder 108 to control a generator 104 powering a load 110 through the feeder 108. The method 200 can also include, at box 204, detecting a fault in one of the first and second sensors 106, 112 and continuing operation of the generator 104. In embodiments, the method 200 can include filtering when detecting a fault in one of the sensors 106,112 and deciding which sensor 106,112 is at fault, as shown at box 206.

The methods and systems of the present disclosure, as described above and shown in the drawings, provide for faster detection of faults within a feeder. Redundancy of sensors allows for optimization of logic to very quickly sense fault and correct with minimal resources. While the apparatus and methods of the subject disclosure have been shown and described, those skilled in the art will readily appreciate that changes and/or modifications may be made thereto without departing from the scope of the subject disclosure.

What is claimed is:
1. A system comprising:
   a generator control unit (GCU) configured to control a generator;
   a first sensor connected to provide feedback to the GCU for generator control, wherein the first sensor is con- figured to sense voltage and/or current in a feeder connecting between the generator and a load;

a second sensor connected to provide feedback to the GCU for generator control, wherein the second sensor is configured to sense voltage and/or current in the feeder connecting between the generator and the load, wherein the first and second sensors are configured to connect to the feeder apart from one another with feeder impedance therebetween; and logic in the GCU configured to cause the GCU to use the feedback from the first and second sensors to control the generator, wherein the logic is configured to detect faults in each of the first and second sensors and continue operation of the generator in the event of only one of the sensors faulting, wherein the logic is configured to cause the GCU to:

detect a discrepancy between the first and second sensors, decide whether the first sensor is at fault or whether the second sensor is at fault when detecting the discrepancy, and control the generator based on the feedback from whichever of the first sensor or the second sensor is not at fault, and wherein the logic is configured to detect the discrepancy by comparing summed magnitudes or magnitudes squared of voltage and/or current sensed for each of three phases of the feeder for each of the first and second sensors versus a respective threshold [V_OSF_TH and −V_OSF_TH] for each of VPOR OSF (voltage open sense failure at a point of regulation for the second sensor) and VGEN OSF (voltage open sense failure at a point of the first sensor), wherein VPOR OSF is logic for comparing the V_OSF_TH threshold to the summed magnitudes or magnitudes squared of voltage and/or current sensed for each of three phases of the feeder for each of the first and second sensor, and wherein VGEN OSF is logic for comparing the −V_OSF_TH threshold to the summed magnitudes or magnitudes squared of voltage and/or current sensed for each of three phases of the feeder for each of the first and second sensor.

2. The system as recited in claim 1, wherein the first sensor is configured to sense at least one of voltage and/or current in each one of the three phases of the feeder.

3. The system as recited in claim 1, wherein the second sensor is configured to sense voltage and/or current in each one of the three phases of the feeder.

4. The system as recited in claim 1, further comprising:
the generator operatively connected to be controlled by the GCU; and
the feeder connected to supply power from the generator to the load, wherein the first sensor is electrically closer to the generator than is the second sensor relative to the feeder impedance.

5. The system as recited in claim 1, wherein each of the VPOR_OSF and VGEN_OSF connects through a latch to a respective switch for switching off faulty feedback from the respective one of the first and second sensors to the GCU.

6. The system as recited in claim 1, wherein the logic is configured to detect the discrepancy by transforming three phases from each of the first and second sensors to Alpha-Beta coordinates, then taking a magnitude of the Alpha-Beta coordinates for each.

7. The system as recited in claim 1, further comprising wherein the logic is configured to perform filtering when deciding whether the first sensor is at fault or whether the second sensor is at fault, wherein the filtering includes at least one of:

difference of magnitudes or magnitudes squared has to exceed a threshold a certain number of consecutive times;

difference of magnitudes or magnitudes squared is processed through an infinite impulse response (IIR) filter; or difference of magnitudes or magnitudes squared is processed through a finite impulse response (FIR) filter.

8. A method comprising:
using feedback from first and second sensors spaced apart along a feeder to control a generator powering a load through the feeder; and detecting a fault in one of the first and second sensors and continuing operation of the generator, wherein detecting the fault in one of the first and second sensors and continuing operation of the generator includes:

detecting a discrepancy between the first and second sensors;

deciding whether the first sensor is at fault or whether the second sensor is at fault when detecting the discrepancy; and controlling the generator based on the feedback from whichever of the first sensor or the second sensor is not at fault, and wherein detecting the discrepancy includes comparing summing summed magnitudes or magnitudes squared of voltage and/or current sensed for each of three phases of the feeder for each of the first and second sensor versus a respective threshold [V_OSF_TH and −V_OSF_TH] for each of VPOR_OSF (voltage open sense failure at a point of regulation for the second sensor) and VGEN_OSF (voltage open sense failure at a point of the first sensor), wherein VPOR_OSF is logic for comparing the V_OSF_TH threshold to the summed magnitudes or magnitudes squared of voltage and/or current sensed for each of the three phases of the feeder for each of the first and second sensor, and wherein VGEN_OSF is logic for comparing the −V_OSF_TH threshold to the summed magnitudes or magnitudes squared of voltage and/or current sensed for each of three phases of the feeder for each of the first and second sensor.

9. The method as recited in claim 8, further comprising filtering when deciding whether the first sensor is at fault or whether the second sensor is at fault, wherein filtering the includes at least one of:

difference of magnitudes or magnitudes squared has to exceed a threshold a certain number of consecutive times;

difference of magnitudes or magnitudes squared is processed through an infinite impulse response (IIR) filter; or difference of magnitudes or magnitudes squared is processed through a finite impulse response (FIR) filter.

10. A system comprising:
a generator control unit (GCU) configured to control a generator;

a first sensor connected to provide feedback to the GCU for generator control, wherein the first sensor is configured to sense of voltage and/or current in a feeder connecting between the generator and a load;

a second sensor connected to provide feedback to the GCU for generator control, wherein the second sensor is configured to sense voltage and/or current in the feeder connecting between the generator and the load, wherein the first and second sensors are configured to connect to the feeder apart from one another with feeder impedance therebetween; and logic in the GCU configured to detect a discrepancy by comparing summed magnitudes or magnitudes squared of voltage and/or current sensed for each of three phases of the feeder for each of the first and second sensor versus a respective threshold [V_OSF_TH and −V_OSF_TH] for each of VPOR_OSF (voltage open sense failure at a point of regulation for the second sensor) and VGEN_OSF (voltage open sense failure at a point of the first sensor), wherein −VPOR_OSF is logic for comparing the V_OSF_TH threshold to the summed magnitudes or magnitudes squared of voltage and/or current sensed for each of three phases of the feeder for each of the first and second sensor, and wherein VGEN_OSF is logic for comparing the −V_OSF_TH threshold to the summed magnitudes or magnitudes squared of voltage and/or current sensed for each of the three phases of the feeder for each of the first and second sensor.

11. The system as recited in claim 10, wherein the first sensor is configured to sense voltage and/or current in each one of the three phases of the feeder.

12. The system as recited in claim 10, wherein the second sensor is configured to sense voltage and/or current in each one of the three phases of the feeder.

13. The system as recited in claim 10, further comprising:
the generator operatively connected to be controlled by the GCU; and
the feeder connected to supply power from the generator to the load, wherein the first sensor is electrically closer to the generator than is the second sensor relative to the feeder impedance.

14. The system as recited in claim 10, wherein the logic in the GCU is configured to cause the GCU to use the feedback from the first and second sensors to control the generator.

15. The system as recited in claim 14, wherein the logic is configured to detect faults in each of the first and second sensors and continue operation of the generator in the event of only one of the sensors faulting.

16. The system as recited in claim 10, wherein each of the VPOR_OSF and VGEN_OSF connects through a latch to a respective switch for switching off faulty feedback from the respective one of the first and second sensors to the GCU.

17. The system as recited in claim 10, wherein the logic is configured to cause the GCU to:
detect a discrepancy between the first and second sensors,
decide whether the first sensor is at fault or whether the second sensor is at fault when detecting the discrepancy, and
control the generator based on the feedback from whichever of the first sensor or the second sensor is not at fault.

18. The system as recited in claim 17, wherein the logic is configured to detect the discrepancy by transforming three phases from each of the first and second sensors to Alpha-Beta coordinates, then taking a magnitude of the Alpha-Beta coordinates for each.

19. The system as recited in claim 17, wherein the logic is configured to perform filtering when deciding weather the first sensor is at fault or whether the second sensor is at fault, wherein the filtering includes at least one of:
difference of magnitudes or magnitudes squared has to exceed a threshold a certain number of consecutive times;
difference of magnitudes or magnitudes squared is processed through an infinite impulse response (IIR) filter; or
difference of magnitudes or magnitudes squared is processed through a finite impulse response (FIR) filter.

* * * * *